(12) United States Patent
Harazono et al.

(10) Patent No.: US 8,012,561 B2
(45) Date of Patent: Sep. 6, 2011

(54) FIBER-REINFORCED RESIN AND METHOD FOR MANUFACTURING THE SAME

(75) Inventors: Masaaki Harazono, Shiga (JP); Masaharu Shirai, Shiga (JP); Katsura Hayashi, Shiga (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 12/594,165

(22) PCT Filed: Mar. 26, 2008

(86) PCT No.: PCT/JP2008/055639
§ 371 (c)(1),
(2), (4) Date: Feb. 2, 2010

(87) PCT Pub. No.: WO2008/120619
PCT Pub. Date: Oct. 9, 2008

(65) Prior Publication Data
US 2010/0136284 A1  Jun. 3, 2010

(30) Foreign Application Priority Data

Mar. 30, 2007  (JP) ................................ 2007-095159
Jun. 27, 2007  (JP) ................................ 2007-169127

(51) Int. Cl.
*B32B 3/12* (2006.01)
(52) U.S. Cl. ..................... 428/116; 428/297.4
(58) Field of Classification Search .................. 428/110, 428/116, 297.4
See application file for complete search history.

(56) References Cited

U.S. PATENT DOCUMENTS

| | | | | |
|---|---|---|---|---|
| 3,308,007 | A | * | 3/1967 | Shepard .................. 428/395 |
| 4,454,184 | A | * | 6/1984 | Britton .................. 428/110 |
| 4,500,600 | A | * | 2/1985 | Wong et al. ............. 428/391 |
| 5,061,545 | A | * | 10/1991 | Li et al. ................. 428/195.1 |
| 5,230,937 | A | * | 7/1993 | Effenberger et al. ...... 428/113 |
| 5,279,879 | A |  | 1/1994 | Takezawa et al. .......... 428/110 |
| 5,466,514 | A | * | 11/1995 | Kataoka et al. ........... 442/81 |
| 5,512,119 | A |  | 4/1996 | Takezawa et al. ......... 156/171 |
| 5,922,445 | A | * | 7/1999 | Yoshida et al. ........... 428/297.4 |
| 6,207,259 | B1 | * | 3/2001 | Iino et al. ............... 428/209 |
| 6,596,373 | B1 | * | 7/2003 | Kishi et al. ............. 428/116 |
| 6,616,971 | B2 | * | 9/2003 | Evans .................... 427/249.3 |
| 6,620,471 | B1 | * | 9/2003 | Do ........................ 428/34.5 |
| 7,651,754 | B2 | * | 1/2010 | Kunieda ................. 428/116 |
| 2006/0172113 | A1 | * | 8/2006 | Kunieda ................. 428/116 |
| 2008/0160860 | A1 | * | 7/2008 | Kuroki et al. ........... 442/370 |
| 2008/0187718 | A1 | * | 8/2008 | Takano et al. ........... 428/147 |
| 2010/0136284 | A1 | * | 6/2010 | Harazono et al. ......... 428/110 |
| 2010/0255286 | A1 | * | 10/2010 | Matsumoto et al. ....... 428/315.5 |

FOREIGN PATENT DOCUMENTS

| | | |
|---|---|---|
| JP | 60-171109 | 9/1985 |
| JP | 03-006241 | 1/1991 |
| JP | 03-221413 | 9/1991 |
| JP | 07-091435 | 4/1995 |
| JP | 10-508720 | 8/1998 |
| JP | 2006-045390 | 2/2006 |
| WO | WO 96/09158 A1 | 3/1996 |

* cited by examiner

*Primary Examiner* — N. Edwards
(74) *Attorney, Agent, or Firm* — DLA Piper LLP (US)

(57) ABSTRACT

A fiber-reinforced resin is provided which includes a fiber bundle 2 comprising a plurality of monofilament layers 20, 21, and 22 being laminated, each of the monofilament layers comprising a plurality of monofilaments 23 arranged in one direction and an adhesive 3 for adhering the monofilaments 23 of the fiber bundle 2 together, and the fiber bundle 2 has a honeycomb-shaped cross section.

7 Claims, 5 Drawing Sheets

FIBER-REINFORCED RESIN AND METHOD FOR MANUFACTURING THE SAME

CROSS-REFERENCE TO THE RELATED APPLICATIONS

This application is a national stage of international application No. PCT/JP2008/055639, filed on Mar. 26, 2008, which also claims the benefit of priority under 35 USC 119 to Japanese Patent Application No. 2007-095159, filed on Mar. 30, 2007 and Japanese Patent Application No. 2007-169127, filed on Jun. 27, 2007, the entire contents of all of which are incorporated herein by reference.

TECHNICAL FIELD

The present invention relates to a fiber-reinforced resin such as a UD prepreg (a prepreg including filaments arranged in one direction and a resin impregnated therein) and a method for manufacturing the fiber-reinforced resin.

BACKGROUND ART

A circuit board has been formed using a UD prepreg. The UD prepreg is formed by impregnating a resin in a fiber bundle in which a plurality of monofilaments is arranged in one direction. In general, monofilaments each having a circular cross section have been used.

DISCLOSURE OF INVENTION

Problems to be Solved by the Invention

In the UD prepreg, when monofilaments each having a circular cross section are used, a contact area between adjacent monofilaments is small, and the ratio of interstices between the monofilaments is increased. As a result, there has been a limit to an increase of the ratio of monofilaments in the UD prepreg.

Accordingly, an object of the present invention is to increase the ratio of monofilaments in a fiber-reinforced resin, such as a UD prepreg, so that properties of the monofilaments are appropriately reflected in the fiber-reinforced resin.

Means for Solving the Problems

In order to achieve the above object, a fiber-reinforced resin according to a first aspect of the present invention comprises a fiber bundle comprising a plurality of monofilament layers being laminated, each of the monofilament layers comprising a plurality of monofilaments arranged in one direction and an adhesive for adhering the plurality of monofilaments together. In addition, the fiber bundle has a honeycomb-shaped cross section perpendicular to a longitudinal direction of the monofilaments.

A fiber-reinforced resin according to a second aspect of the present invention comprises a fiber bundle comprising a plurality of monofilament layers being laminated, each of the monofilament layers comprising a plurality of monofilaments arranged in one direction and an adhesive for adhering the plurality of monofilaments together. In addition, the monofilaments have corner portions at parts of cross sections thereof perpendicular to a longitudinal direction of the monofilaments. Furthermore, between adjacent monofilament layers, corner portions of monofilaments of one monofilament layer protrude toward dimples formed between adjacent monofilaments of the other monofilament layer.

A fiber-reinforced resin according to a third aspect of the present invention comprises a fiber bundle comprising a plurality of monofilament layers being laminated, each of the monofilament layers comprising a plurality of monofilaments arranged in one direction and an adhesive for adhering the plurality of monofilaments together. In addition, each monofilament has a flat or an approximately flat facing surface to face an adjacent monofilament. Furthermore, in the monofilament, the ratio of a side length of a portion corresponding to the facing surface to an outer circumference of a cross section of each monofilament perpendicular to a longitudinal direction thereof is in the range of 30% to 90% of the outer circumference of each monofilament.

A method for manufacturing a fiber-reinforced resin according to a fourth aspect of the present invention comprises a heat compression step of, heat-compressing a fiber bundle to obtain a compressed fiber bundle, the fiber bundle comprising a plurality of monofilament layers being laminated, each of the monofilament layers comprising a plurality of monofilaments arranged in one direction in a lamination direction.

A method for manufacturing a fiber-reinforced resin according to a fifth aspect of the present invention comprises a sealing step of sealing a fiber bundle comprising a plurality of monofilament layers being laminated, each of the monofilament layers comprising a plurality of monofilaments arranged in one direction with a metal foil and a compression step of compressing the fiber bundle sealed with the metal foil in an inert gas atmosphere by applying a gas pressure to obtain a compressed fiber bundle.

BEST MODES FOR CARRYING OUT THE INVENTION

A fiber-reinforced resin according to an embodiment of the present invention is used for circuit boards mounting electronic components, bodies of airplanes and ships, rackets for tennis and badminton, fishing rods, shafts of golf clubs, and the like. The fiber-reinforced resin according to the embodiment of the present invention includes monofilaments and an adhesive, and details of the monofilaments, the adhesive, and the like are determined in accordance with the application of the fiber-reinforced resin.

Hereinafter, a fiber-reinforced resin primarily used for forming a circuit board is described.

Figure 1:
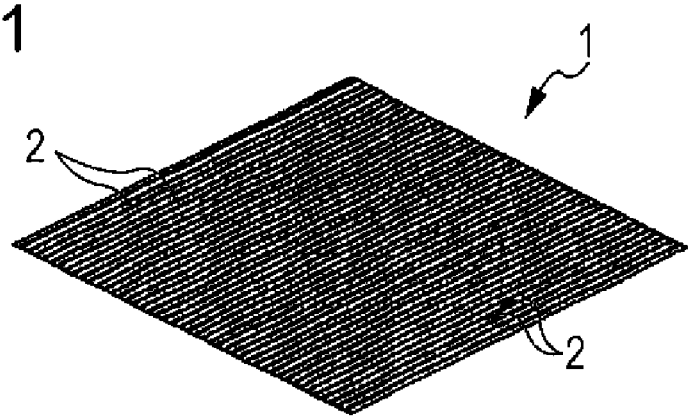
FIG. 1 is an entire perspective view showing a UD prepreg which is one example of a fiber-reinforced resin according to an embodiment of the present invention.
Figure 2:
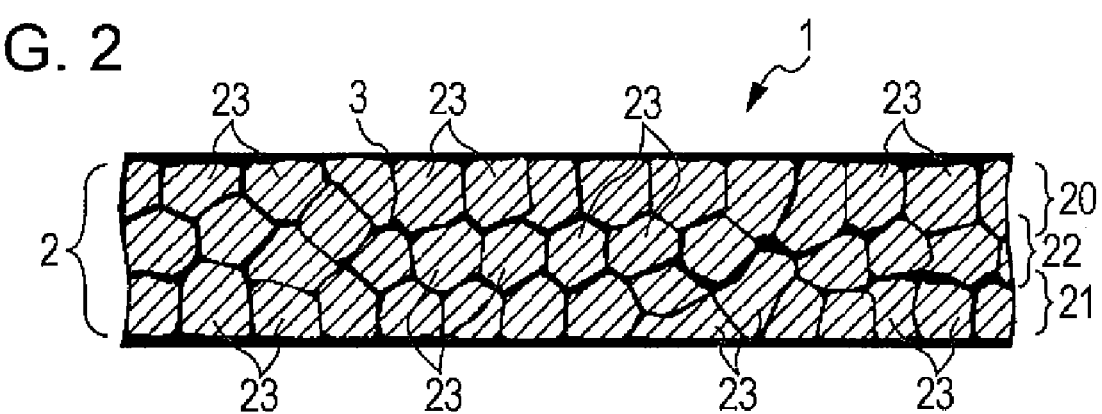
FIG. 2 is a cross-sectional view showing a main portion of the UD prepreg shown in FIG. 1.

A UD prepreg 1 shown in FIGS. 1 and 2 is one example of the fiber-reinforced resin and includes a fiber bundle 2 and an adhesive 3.

Figure 3:
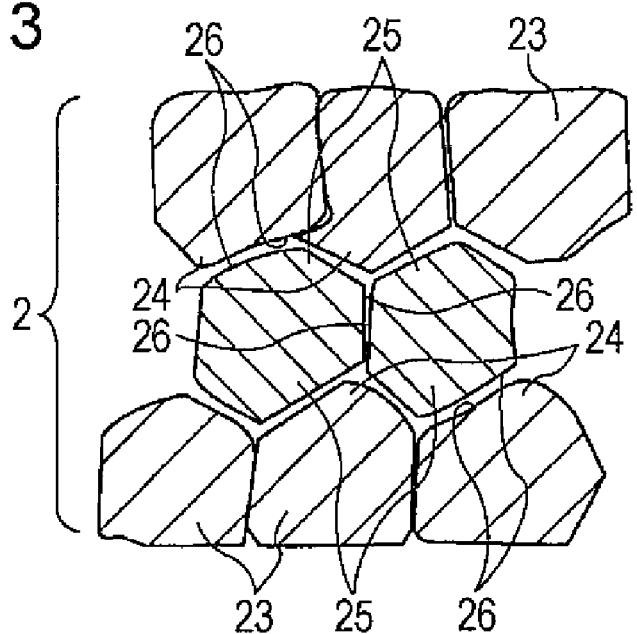
FIG. 3 is an enlarged cross-sectional view showing a main portion of a fiber bundle in the UD prepreg shown in FIG. 1.

As shown in FIGS. 2 and 3, the fiber bundle 2 is a laminate containing three monofilament layers 20, 21, and 22 and has a honeycomb-shaped cross section (Honeycomb like structure). The fiber bundle may at least partly have a honeycomb-shaped cross section. In addition, a volume ratio of the fiber bundle 2 to the UD prepreg 1 is, for example, from 70% to 90%. The cross section indicates a cross section perpendicular to a longitudinal direction of monofilaments which is described later. In addition, the honeycomb like structure indicates that cross sections of monofilaments 23 are each formed to have a polygon, such as a tetragon, a pentagon, a hexagon, or the like, and that the monofilaments 23 are aggregated to have a higher density in order to decrease the amount of the adhesive 3 used between the monofilaments 23 in the fiber bundle 2. In this embodiment, the reason the shape is expressed as the honeycomb like structure is that a cross-sectional structure of the fiber bundle 2 is similar to a honeycomb when the cross sections of the monofilaments 23 are regarded as holes thereof, and when the adhesive 3 is regarded as walls surrounding the holes of the honeycomb.

The monofilament layers 20 to 22 are each formed of the monofilaments 23 arranged in one direction. A plurality of monofilaments 23 are each formed to have a polygonal or an approximately polygonal cross section. The monofilament layers 20 to 22 includes outermost layers 20 and 21 containing the monofilaments 23 each having a pentagonal or an approximately pentagonal cross section, and an intermediate layer 22 containing the monofilaments 23 having a hexagonal or an approximately hexagonal cross section. The outermost layers 20 and 21 represent monofilament layers located at a primary surface and the other primary surface of the fiber bundle 2, and the intermediate layer 22 represents a monofilament layer provided between the outermost layers 20 and 21.

In the UD prepreg 1, when the outermost layers 20 and 21 are assumed to contain the monofilaments 23 each having a pentagonal (approximately pentagonal) shape, and the intermediate layer 22 is assumed to contain the monofilaments 23 each having a hexagonal (approximately hexagonal) shape, while the surfaces of the fiber bundle 2 are planarized, the monofilaments can be arranged to decrease the ratio of interstices in a cross section of the fiber bundle 2; hence, the ratio of the fiber bundle can be ensured to be high.

The monofilaments 23 each have a cross-sectional area in the range of $7.85 \times 10^{-5}$ to $7.07 \times 10^{-4}$ mm$^2$ (the diameter of a circle corresponding to the cross-sectional area is, for example, in the range of 5 to 15 µm) and are formed from a material having a lower coefficient of thermal expansion than the adhesive 3. The coefficient of thermal expansion of the monofilament in the longitudinal direction thereof is, for example, from −10 ppm/° C. to 5 ppm/° C. In addition, the coefficient of thermal expansion of the monofilament in a cross-sectional direction which is perpendicular to the longitudinal direction is from 50 ppm/° C. to 100 ppm/° C.

As the monofilaments 23, for example, organic fibers primarily composed of a wholly aromatic polyester resin, a wholly aromatic polyamide resin, a polyparaphenylene benzobisoxazole resin, or a liquid crystal polymer resin, or inorganic fibers, such as S glass or T glass, may be used. In this embodiment, the liquid crystal polymer resin indicates a polymer showing liquid crystallinity in a molten state or a solution state or a polymer showing optical birefringence and, in general, includes a lyotropic liquid crystal polymer showing liquid crystallinity in a solution state, a thermotropic liquid crystal polymer showing liquid crystallinity in a molten state, or a type 1, a type 2, or a type 3 liquid crystal polymer which is classified in accordance with its heat distortion temperature.

As shown in FIG. 3, most of the monofilaments 23 have corner portions 24 and 25 and facing surfaces 26 in a cross-sectional shape.

The corner portion 24 (25) is preferably defined by a curved surface having a curvature radius of 0.1 to 3 µm. Since the curvature radius of the corner portion is set to 0.1 µm or more, generation of cracks at a front end of the corner portion can be suppressed, and the monofilaments are prevented from being broken. In addition, since the curvature radius of the corner portion is set to 3 µm or less, the ratio of interstices between the monofilaments can be decreased, and the density of the monofilaments in a prepreg can be increased, so that properties of the monofilaments can be effectively obtained.

As for the corner portions 24 and 25 of the monofilaments 23 in cross sections of the adjacent monofilament layers 20 to 22, the corner portions 24 (25) of monofilaments 23 of the monofilament layers 20 and 21 (22) protrude toward dimples D formed between adjacent monofilaments 23 of the other monofilament layer 22 (20 and 21). As a result, since the monofilaments 23 can be arranged to decrease the ratio of interstices in the cross section of the fiber bundle 2, the ratio of the fiber bundle in the UD prepreg 1 can be ensured to be high. That is, three imaginary circles along inner circumferences of monofilaments are disposed to be in contact with each other and surround an imaginary area. When at least part of the imaginary area is occupied by corner portions of monofilaments, the ratio of interstices between the monofilaments in the cross section of the fiber bundle 2 can be decreased, and the ratio of the fiber bundle 2 in the UD prepreg 1 can be increased.

The facing surfaces 26 face adjacent monofilaments 23 and are flat or approximately flat surfaces. In outer circumferences of the cross sections of the monofilaments 23, the facing surface 26 preferably has a ratio of 30% to 95% of the whole outer circumference of the cross section of the monofilament 23. Since the facing surface 26 has a ratio of 30% or more of the whole circumference of the monofilament, the density of the monofilaments in the prepreg can be increased, and hence the properties of the monofilaments can be effectively obtained. In addition, since the facing surface 26 has a ratio of 95% or less of the whole circumference of the monofilament, a pressure applied thereto is suppressed from being unnecessarily increased when the monofilaments are manufactured, and hence the monofilaments are prevented from being broken. When the monofilaments have the facing surfaces 26 as described above, unnecessary interstices are not formed between monofilaments 23 adjacent to each other, and hence the ratio of the fiber bundle 2 in the UD prepreg 1 can be ensured to be high.

The adhesive 3 is used to adhere the monofilaments 23 together in the fiber bundle 2 and is present between adjacent monofilaments 23. This adhesive 3 is designed, for example, to have a coefficient of thermal expansion of 20 to 60 ppm/° C. As the adhesive having the coefficient of thermal expansion as described above, an adhesive formed of an epoxy resin and a non-metallic inorganic filler (such as spherical silica) of 20 to 80 percent by weight may be used.

The coefficient of thermal expansion of the monofilament 23 and that of the adhesive 3 are values measured in accordance with JIS K7197 and can be measured, for example, using "SSC/5200" (manufactured by Seiko Instruments Inc.).

In the UD prepreg 1, the fiber bundle 2 has a honeycomb-shaped cross section, and the monofilaments 23 are arranged so that the ratio of interstices between adjacent monofilaments 23 of the fiber bundle 2 is decreased. As a result, the ratio (on a volume basis) of the fiber bundle 2 in the UD prepreg 1 can be increased to the range of 70% to 90% which cannot be achieved in a case of monofilaments each having a circular cross section perpendicular to a longitudinal direction thereof. Accordingly, the properties of the monofilaments 23 can be sufficiently reflected in the UD prepreg 1.

Specifically, when the monofilaments 23 are formed from a material having a lower coefficient of thermal expansion than that of the adhesive 3, the property, that is, a low coefficient of thermal expansion, of the monofilaments 23 can be reflected in the UD prepreg 1, and as a result, the coefficient of thermal expansion of the UD prepreg 1 can be decreased. When the coefficient of thermal expansion of the monofilament 23 in the longitudinal direction is set to be from −10 ppm/°C. to 5 ppm/°C., and the coefficient of thermal expansion of the adhesive 3 is set to be from 20 ppm/°C. to 60 ppm/°C., the coefficient of thermal expansion of the UD prepreg 1 can be made close to that of silica which is used as a base material of electronic components such as semiconductor elements. As a result, the UD prepreg 1 can be provided as a circuit board having a small difference in coefficient of thermal expansion from that of an electronic component. Accordingly, when an electronic component is mounted on the circuit board and is driven, a thermal stress acting between the circuit board and the electronic component can be decreased, and as a result, connection stability of the electronic component and reliability thereof can be improved.

Next, a method for manufacturing the UD prepreg 1 is described with reference to a UD prepreg manufacturing apparatus 4 shown in FIG. 4.

The UD prepreg manufacturing apparatus 4 includes a fiber bundle supply roller 40, a heat compression mechanism 41, a resin-impregnating bath 42, a heating mechanism 43, and a winding roller 44.

Figure 5A:
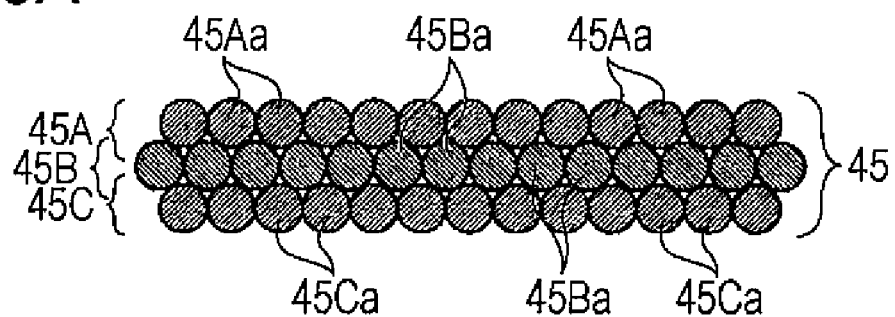
FIG. 5A is a cross-sectional view of a fiber bundle before heat compression is performed.

The fiber bundle supply roller 40 is a roller around which a fiber bundle 45 is wound. The fiber bundle 45 wound around the fiber bundle supply roller 40 is a laminate formed by laminating three monofilament layers 45A, 45B, and 45C comprising monofilaments 45Aa, 45Ba, and 45Ca, respectively, each having a circular cross section as shown in FIG. 5A.

Figure 4:
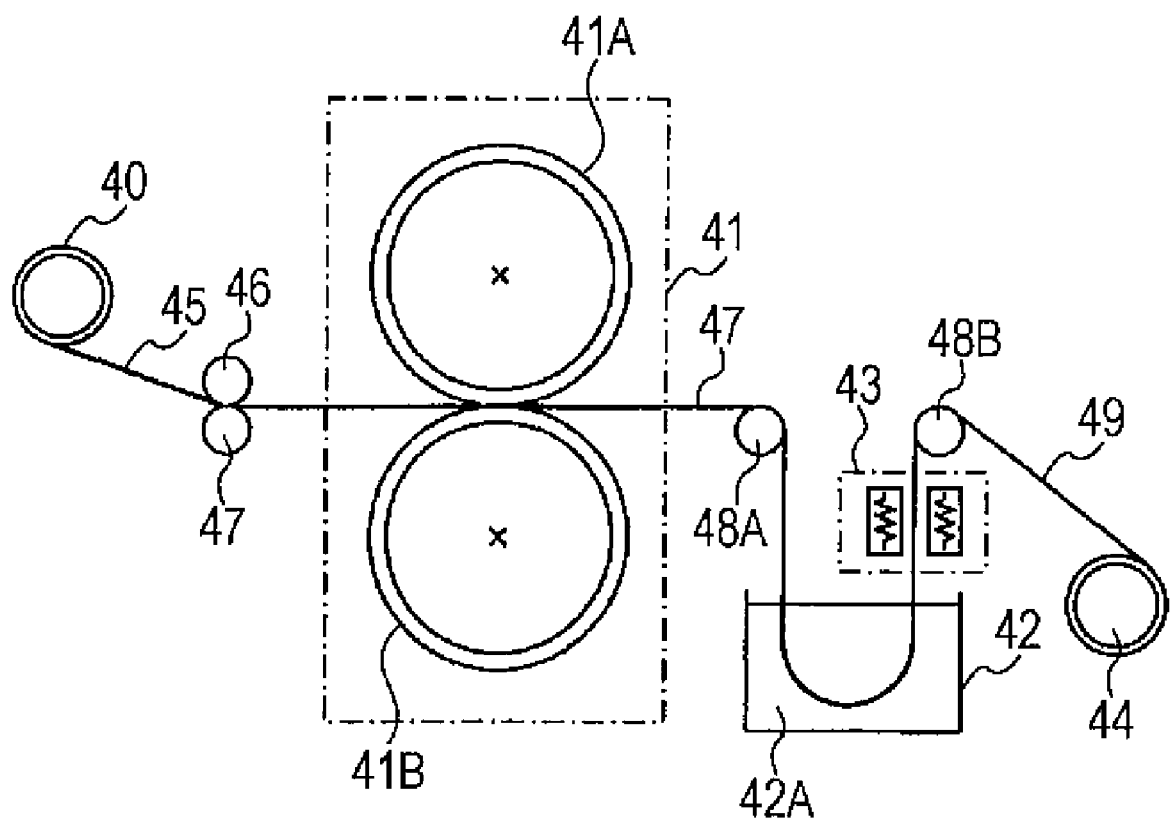
FIG. 4 is a schematic view showing a basic structure of an apparatus for manufacturing the UD prepreg shown in FIG. 1.

The fiber bundle 45 wound around the fiber bundle supply roller 40 shown in FIG. 4 is supplied to the heat compression mechanism 41 by guides 46 and 47.

The heat compression mechanism 41 is a mechanism for heat-compressing the fiber bundle 45 to deform the monofilaments 45Aa, 45Ba, and 45Ca of the fiber bundle 45. This heat compression mechanism 41 includes a pair of pressure rollers 41A and 41B. The pair of pressure rollers 41A and 41B are rollers for pressing the fiber bundle 45 when the fiber bundle 45 passes therebetween. A force to be applied to the fiber bundle 45 can be adjusted by the distance between the pair of pressure rollers 41A and 41B, surface materials (surface hardnesses) thereof, and the like and is preferably set to be from 10 MPa to 300 MPa. Since the pressure to the fiber bundle 45 is set to 10 MPa or more, the fiber bundle can be sufficiently compressed and can be deformed. In addition, since the pressure to the fiber bundle 45 is set to 300 MPa or less, breakage of the fiber bundle due to an unnecessarily high pressure applied thereto is suppressed.

For heating of the fiber bundle 45 by the heat compression mechanism 41, heaters are embedded in the pressure rollers 41A and 41B, and heating is performed when the fiber bundle passes between the pair of pressure rollers 41A and 41B. A heating temperature by the heat compression mechanism 41 may be determined in consideration of the composition and the diameter of the monofilaments of the fiber bundle 45 and a desired compression rate thereof and is preferably performed at a temperature at which the fiber bundle 45 (monofilaments 45Aa, 45Ba, and 45Ca) are softened but are not melted, such as in the range of 70°C. to 450°C. Of course, heating of the fiber bundle 45 is not always performed by the pressure rollers 41A and 41B and may be performed by a heater provided in the heat compression mechanism 41.

Figure 5B:
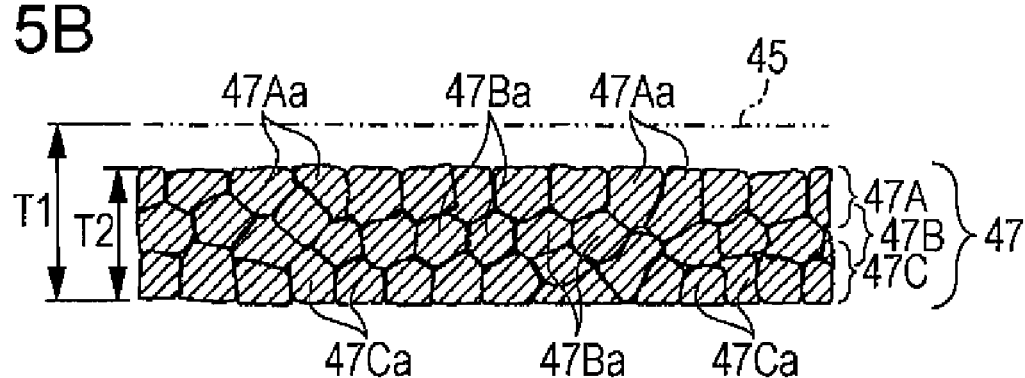
FIG. 5B is a cross-sectional view of the fiber bundle after the heat compression is performed.
Figure 5C:
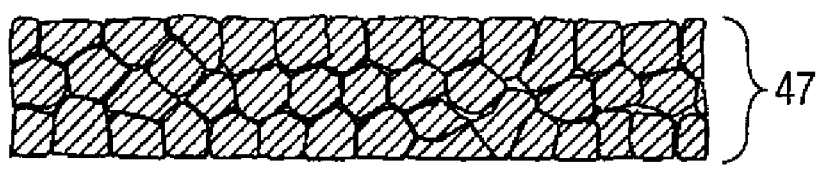
FIG. 5C is a cross-sectional view of the fiber bundle in which interstices are formed between monofilaments after the heat compression is performed.

A fiber bundle 47 (see FIG. 5B) as a compressed fiber bundle after passing between the pair of pressure rollers 41A and 41B is compressed and deformed as compared to the fiber bundle 45 (see FIG. 5A) before passing between the pressure rollers 41A and 41B. As shown in FIG. 5B, a thickness T2 of the fiber bundle 47 is preferably set to be from 65% to 95% of a thickness T1 of the fiber bundle 45. Since the thickness T2 is set to 65% or more of the thickness T1, breakage of the fiber bundle due to a pressure applied thereto is suppressed. In addition, since the thickness T2 is set to 95% or less of the thickness T1, the density of the monofilaments of the prepreg is increased, and hence the properties of the monofilaments can be effectively obtained.

When the fiber bundle 45 is heated and compressed as described above, the monofilaments 45Aa, 45Ba, and 45Ca are compressed to each other and are deformed so as to decrease the ratio of interstices. As a result, in the fiber bundle 47, facing surfaces 26 are formed between adjacent monofilaments 47Aa, 47Ba, and 47Ca and are brought into close contact with each other, and corner portions 24 and 25 are formed on adjacent monofilaments 47Aa, 47Ba, and 47Ca in a lamination direction (top-to-bottom direction in the figure) and are brought into close contact with each other. Accordingly, in the fiber bundle 47, the monofilaments 47Aa, 47Ba, and 47Ca are arranged so that interstices are hardly observed.

The fiber bundle 47 which is compressed and deformed in the heat compression mechanism 41 is supplied to the resin-impregnating bath 42. This resin-impregnating bath 42 contains a resin varnish 42A to be impregnated between the fiber bundles 47. The fiber bundle 47 hanging from drive rollers 48A and 48B is supplied to the resin-impregnating bath 42. Since the fiber bundle 47 hangs from the drive rollers 48A and 48B as described above, the fiber bundle 47 hardly receives a tension and is bent to form a U shape. As a result, when the fiber bundle 47 passes through the resin-impregnating bath 42, interstices are formed between the monofilaments of the fiber bundle 47 and the resin is impregnated therein.

In addition, as another method for forming the fiber bundle 47, resin layers having a thickness, for example, of 0.2 to 4 µm may be provided beforehand between monofilaments, and the monofilaments provided with the resin layers may be heated and compressed. Since the thickness of the resin layer is set to 0.2 µm or more, parts of molten resin layers are sufficiently impregnated between the monofilaments, and hence the monofilaments can be effectively adhered to each other. In addition, since the thickness of the resin layer is set to 4 µm or less, parts of molten resin layers can be suppressed from being unnecessarily impregnated between the monofilaments. As a result, it becomes less likely that, due to the excessively increased distance between the monofilaments, the monofilaments are not compressed to each other and are not deformed by compression, and thus the monofilaments can be easily compressed and can be sufficiently deformed.

The fiber bundle 47 impregnated with the resin passes through the heating mechanism 43. In this heating mechanism 43, since the fiber bundle 47 is heated, a solvent contained in the resin varnish 42A impregnated in the fiber bundle 47 is evaporated, so that a belt-shaped prepreg 49 is formed. After being wound around the winding roller 44, this prepreg 49 is then cut into sheets having a desired size for manufacturing circuit boards and the like.

In the method for manufacturing a UD prepreg described above, since the fiber bundle 45 is compressed and deformed while it is heated, the adjacent monofilaments 47Aa, 47Ba, and 47Ca of the fiber bundle 47 are brought into close contact with each other and are deformed so as to decrease the ratio of interstices as much as possible. As a result, the fiber bundle 47 is in the state in which the ratio of interstices is small, and hence a UD prepreg 49 in which the ratio of the monofilaments 47Aa, 47Ba, and 47Ca is high can be obtained.

In addition, when interstices are formed in the compressed fiber bundles 47, and the resin varnish 42A is impregnated in the interstices, the resin varnish 43A is appropriately impregnated between the monofilaments 47Aa, 47Ba, and 47Ca of the fiber bundle 47, and the monofilaments 47Aa, 47Ba, and 47Ca can be appropriately adhered to each other. In this case, since the resin varnish 42A is impregnated in the interstices which are slightly formed, and the solvent thereof is evaporated, the amount of the resin which is impregnated in and adheres to the fiber bundle 47 is very small. As a result, in the prepreg 49 obtained after the solvent of the resin varnish 42A is evaporated, the ratio of the monofilaments is increased. Accordingly, the prepreg 49 in which the properties of the monofilaments 47Aa, 47Ba, and 47Ca are appropriately reflected can be formed.

The present invention is not limited to the embodiment described above. For example, the step in which the resin is impregnated in the compressed and deformed fiber bundle 47 may be performed by using a different apparatus from that used in the heat compression step performed for the fiber bundle 45, and as a method for forming interstices between the monofilaments 47Aa, 47Ba, and 47Ca of the compressed and deformed fiber bundle 47, for example, another method, such as a method for applying vibration, may also be used.

Figure 6:
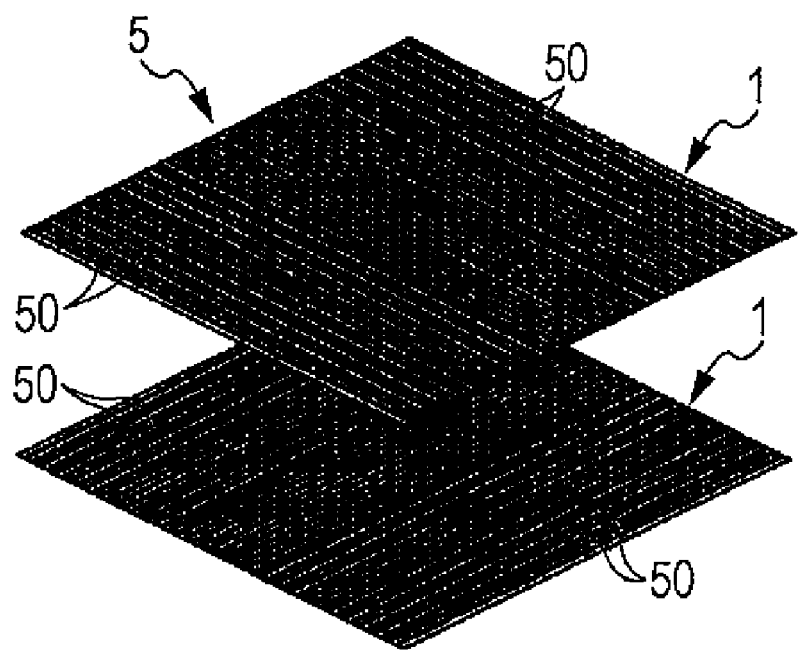
FIG. 6 is an exploded perspective view illustrating an orthogonal UD prepreg which is another example of the fiber-reinforced resin according to the embodiment of the present invention.

The fiber-reinforced resin according to the embodiment of the present invention may also be formed in such a way that as shown in FIG. 6, two UD prepregs 1 are bonded to each other so that axis directions of the fiber bundles 2 thereof are orthogonally intersected to form an orthogonal UD prepreg 5.

Figure 7:
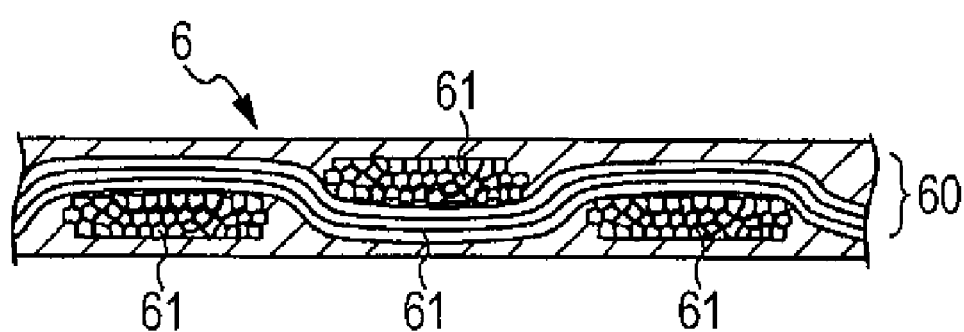
FIG. 7 is a cross-sectional view illustrating a prepreg sheet using a woven fabric which is another example of the fiber-reinforced resin according to the embodiment of the present invention.

In addition, the present invention may also be applied to a fiber bundle forming a woven fabric 60 of a woven-fabric prepreg 6 as shown in FIG. 7.

As described above, the UD prepreg 1 according to the embodiment of the present invention is not limited to that formed by the UD prepreg manufacturing apparatus 4 and may be formed by a method described below.

A method for manufacturing a fiber-reinforced resin is described with reference to FIGS. 8A and 8B.

Figure 8A:
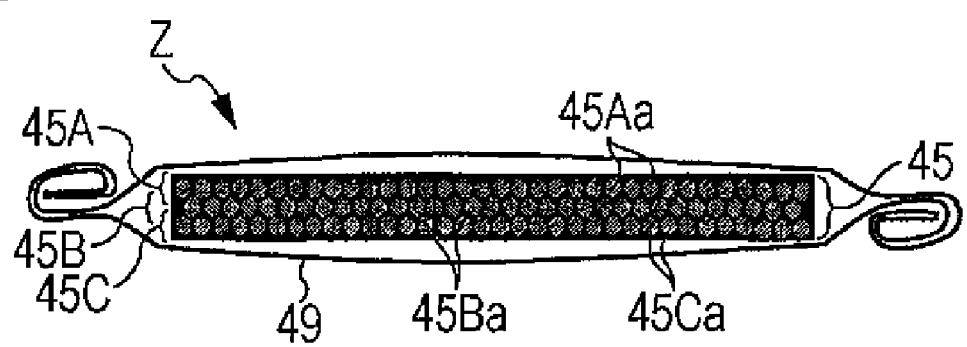
FIG. 8A is an enlarged cross-sectional view of a fiber bundle wound with metal foils.

As shown in FIG. 8A, first, the fiber bundle 45 is wound with metal foils 49 formed, for example, of copper or aluminum and having a thickness of approximately 0.05 mm and is isolated from outside air. The fiber bundle 45 as described above is composed of a laminate of the three monofilament layers 45A, 45B, and 45C which contain the monofilaments 45Aa, 45Ba, and 45Ca, respectively, each having a circular cross section. This fiber bundle 45 is impregnated with an uncured resin 48.

The volume ratio of the resin 48 impregnated in the fiber bundle 45 is preferably 40% or less of the volume including the fiber bundle 45 and the resin 48. When the volume ratio of the resin 48 is 40% or less, a gas pressure applied to the fiber bundle 45, which is to be transmitted to the monofilaments, is not likely to be reduced, and the monofilaments 45Aa, 45Ba, and 45Ca can be sufficiently deformed.

A method for sealing the fiber bundle 45 with the metal foils 49 is described. In particular, after the fiber bundle 45 is sandwiched with the two metal foils 49, end portions thereof are folded at least two times, and the folded portions are each caulked by pressing. The caulked portions are each bonded, for example, using a heat resistant sealing material, or by soldering, brazing, welding, or the like.

Figure 8B:
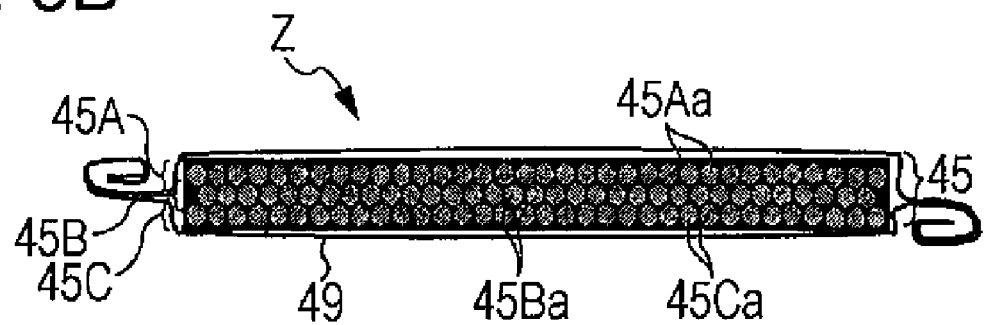
FIG. 8B is an enlarged cross-sectional view of the fiber bundle when the inside of the metal foils is evacuated.

Next, as shown in FIG. 8B, an enclosed space between the metal foils 49 is vacuumized. In order to vacuumize the enclosed space between the metal foils 49, when the metal foils are joined each other, parts of end portions thereof are not joined, and a pipe is welded to the non-joined portions. Subsequently, air between the metal foils 49 is removed through this pipe, so that the inside can be vacuumized. Furthermore, while the vacuum state in the metal foils 49 is maintained, the pipe is crushed by a press machine and is then removed, and a portion from which the pipe is removed is welded. Among methods for sealing the fiber bundle 45 with the metal foils 49, in particular, an electron beam welding method is preferably used. Since welding can be performed by an electron beam welding method while the enclosed space between the metal foils 49 is vacuumized, easy operation can be advantageously performed.

As described later, when the gas pressure is applied to the metal foils 49, if the fiber bundle 45 is not sealed with the metal foils 49, an inert gas enters the inside of the metal foils 49 and further enters the uncured resin 48 impregnated in the fiber bundle 45. When the gas pressure is applied to the metal foils 49 in the state in which an inert gas enters the resin 48, the fiber bundle 45 may be partly deformed in some cases by the pressure of the gas mixed in the resin 48. In addition, the gas may gradually escape from the inside of a finished UD prepreg and may accumulate inside a circuit board which uses the UD prepreg. As a result, for example, the gas inside the circuit board may be expanded by heat, and hence the circuit board may be warped in some cases. In the manufacturing method according to the embodiment of the present invention, since being sealed with the metal foils 49, an inert gas is suppressed from entering the resin 48 impregnated in the fiber bundle 45.

Next, the metal foils 49 which seal the fiber bundle 45 are placed in an inert gas atmosphere containing an argon gas, a nitrogen gas, or the like, and the fiber bundle is sufficiently compressed by applying a gas pressure to the metal foils 49, so that the fiber bundle can be deformed. The gas pressure is preferably set to 50 to 300 MPa. Since the gas pressure to the metal foils 49 is set to 50 MPa or more, the metal foils 49 can be sufficiently compressed, and the fiber bundle 45 therein can be deformed. In addition, since the pressure to the metal foils 49 is set to 300 MPa or less, the pressure is not unnecessarily applied to the metal foils 49, and hence the fiber bundle therein is suppressed from being broken.

Furthermore, it is preferable that while the gas pressure is applied to the metal foils 49, heat at a temperature of 100° C. to 450° C. is preferably applied thereto. Since heat at a temperature of 100° C. or more is applied to the metal foils 49, the heat is transmitted from the metal foils 49 to the resin 48 impregnated in the fiber bundle 45, and the resin 48 can be cured, so that the deformed fiber bundle can be fixed by the cured resin 48 while the deformed state is maintained. In addition, since heat at a temperature of 450° C. or less is applied to the metal foils 49, the fiber bundle is softened but is not melted, and hence the shape of the deformed fiber bundle can be maintained. In addition, the time for applying the gas pressure and the heat to the metal foils 49 is set, for example, in the range of 30 to 120 minutes. Subsequently, the metal foils 49 are cooled to room temperature, and the UD prepreg 1 can be formed. In addition, after a plurality of fiber bundles 45 is included in the metal foils 49, and the metal foils 49 are folded so that the fiber bundles 45 are not in contact with each other, when the method described above is performed, a plurality of UD prepregs 1 can be formed at the same time, and the productivity can be improved.

When the gas pressure is applied to the fiber bundle 45 as described above, the monofilaments 45Aa, 45Ba, and 45Ca are compressed to each other and are deformed so as to decrease the ratio of interstices. Accordingly, in the fiber bundle 47, the monofilaments 47Aa, 47Ba, and 47Ca are arranged so that the interstices are hardly observed, and the fiber-reinforced resin of the present invention can be manufactured.

In addition, in the method for manufacturing a fiber-reinforced resin using a gas pressure described above, the gas pressure is applied to the metal foils 49 in the state in which the uncured resin 48 is impregnated beforehand in the fiber bundle 45; however, while the resin 48 is not impregnated in the fiber bundle 45, the gas pressure may be applied to the metal foils 49 to deform the fiber bundle 45.

In addition, a fiber-reinforced resin can also be formed by using a frame member formed from a material similar to a material for the metal foil 49 instead of the metal foils 49. In particular, the fiber bundle 45 is disposed in the frame member, and stainless steel plates are adhered to the top and the bottom of the frame member. Next, the stainless steel plates are welded to the frame member, for example, by an electron beam welding method, so that the fiber bundle 45 is sealed with the stainless steel plates and the frame member. Furthermore, by applying the gas pressure in the state that the fiber bundle 45 is sealed, the stainless steel plates are deformed to compress the fiber bundle 45, and the fiber bundle is deformed. As a result, as in the method using metal foils described above, a fiber-reinforced resin can be formed.

The invention claimed is:

1. A fiber-reinforced resin comprising:
a fiber bundle comprising a plurality of monofilament layers being laminated, each of the monofilament layers comprising a plurality of monofilaments; and
an adhesive resin adhering the plurality of monofilaments together,
wherein the monofilaments have a honeycomb-shaped cross section perpendicular to a longitudinal direction of the monofilaments,
wherein the monofilaments have polygonal or approximately polygonal cross sections perpendicular to the longitudinal direction of the monofilaments,
wherein the monofilament layers comprises outermost monofilament layers at primary surfaces of the fiber bundle, and an intermediate monofilament layer arranged between the outermost monofilament layers,
wherein the monofilaments in the outermost monofilament layers have a pentagonal or an approximately pentagonal cross section perpendicular to the longitudinal direction of the monofilaments, and
wherein the monofilaments in the intermediate monofilament layer have a hexagonal or an approximately hexagonal cross section perpendicular to the longitudinal direction of the monofilaments.

2. A fiber-reinforced resin comprising:
a fiber bundle comprising a plurality of monofilament layers being laminated, each of the monofilament layers comprising a plurality of monofilaments;
an adhesive resin adhering the plurality of monofilaments together,
wherein the monofilaments have a honeycomb-shaped cross section perpendicular to a longitudinal direction of the monofilaments,
wherein the monofilament has a corner portion formed at a part of an outer circumference of the cross section thereof perpendicular to the longitudinal direction of the monofilament, and
wherein the corner portions comprises a curved surface having a curvature radius of 0.1 to 3 μm.

3. A fiber-reinforced resin comprising:
a fiber bundle comprising a plurality of monofilament layers being laminated, each of the monofilament layers comprising a plurality of monofilaments; and
an adhesive resin adhering the plurality of monofilaments together,
wherein the monofilaments have a honeycomb-shaped cross section perpendicular to a longitudinal direction of the monofilaments, and
wherein the monofilaments comprise a material having a lower coefficient of thermal expansion than that of the adhesive resin.

4. A fiber-reinforced resin comprising:
a fiber bundle comprising a first monofilament layer including monofilaments and a second monofilament layer including monofilaments, the second monofilament layer being adjacent to the first monofilament layer; and
an adhesive resin for adhering the monofilaments in the first and the second monofilament layers together,
wherein the monofilaments have corner portions at parts of outer circumferences of cross sections perpendicular to a longitudinal direction of the monofilaments,
wherein at least one monofilament in the first monofilament layer has a corner portion which protrudes toward dimples formed between adjacent monofilaments in the second monofilament layer.

5. The fiber-reinforced resin according to claim 4, wherein the monofilaments comprise a material having a lower coefficient of thermal expansion than that of the adhesive resin.

6. A fiber-reinforced resin comprising: a fiber bundle comprising:
a plurality of monofilament layers being laminated, each of the monofilament layers comprising a plurality of monofilaments; and
an adhesive resin for adhering the plurality of monofilaments together,
wherein the monofilaments have flat or approximately flat facing surfaces to face adjacent monofilaments, and
in outer circumferences of cross sections of the monofilaments perpendicular to a longitudinal direction thereof, a length ratio of a side portion corresponding to each facing surface is 30% to 95% of the outer circumference of each monofilament.

7. The fiber-reinforced resin according to claim 6, wherein the monofilaments comprise a material having a lower coefficient of thermal expansion than that of the adhesive resin.

* * * * *